United States Patent [19]
Grabow

[11] Patent Number: 5,084,952
[45] Date of Patent: Feb. 4, 1992

[54] METHOD AND APPARATUS FOR INCREASING A SUBSTRATE PROCESSING AREA WITHOUT INCREASING THE LENGTH OF A MANUFACTURING LINE

[75] Inventor: Glen M. Grabow, Pendleton, Ind.

[73] Assignee: Cencorp, Inc., Longmont, Colo.

[21] Appl. No.: 601,047

[22] Filed: Oct. 23, 1990

Related U.S. Application Data

[63] Continuation of Ser. No. 433,091, Nov. 7, 1989, abandoned.

[51] Int. Cl.⁵ .............................................. B23Q 7/00
[52] U.S. Cl. .................................. 29/33 P; 29/563; 198/346.1; 409/132; 409/159
[58] Field of Search ............... 198/346.1; 29/33 P, 29/563, 759; 409/132, 145, 159, 160, 162, 172, 227

[56] References Cited

U.S. PATENT DOCUMENTS

| | | | |
|---|---|---|---|
| 2,542,986 | 2/1951 | Bowen | 409/159 |
| 2,667,091 | 1/1954 | Bowen | 409/159 |
| 4,309,600 | 1/1982 | Perry et al. | 29/33 P |
| 4,708,232 | 11/1987 | Hata et al. | 198/346.1 |

FOREIGN PATENT DOCUMENTS

| | | | |
|---|---|---|---|
| 238612 | 10/1986 | Japan | 198/346.1 |
| 865614 | 9/1981 | U.S.S.R. | 409/159 |

OTHER PUBLICATIONS

Universal General Specification GS—318, High Speed SMC Placement Systems 4780 and 4782 HSP, Jan. 1991.

Primary Examiner—Daniel W. Howell
Attorney, Agent, or Firm—Fidelman & Wolffe

[57] ABSTRACT

A manufacturing line along which PCB's are fed and operated on includes a processing fixture for receiving an individual board and displacing it clear of the line toward a router bit. The router bit is shiftable transverse of the line, and the processing fixture is shiftable parallel to the line and in an underlapping relation to adjacent stations so as to address the whole area of the board with the router bit without increasing the length of the manufacturing line.

18 Claims, 2 Drawing Sheets

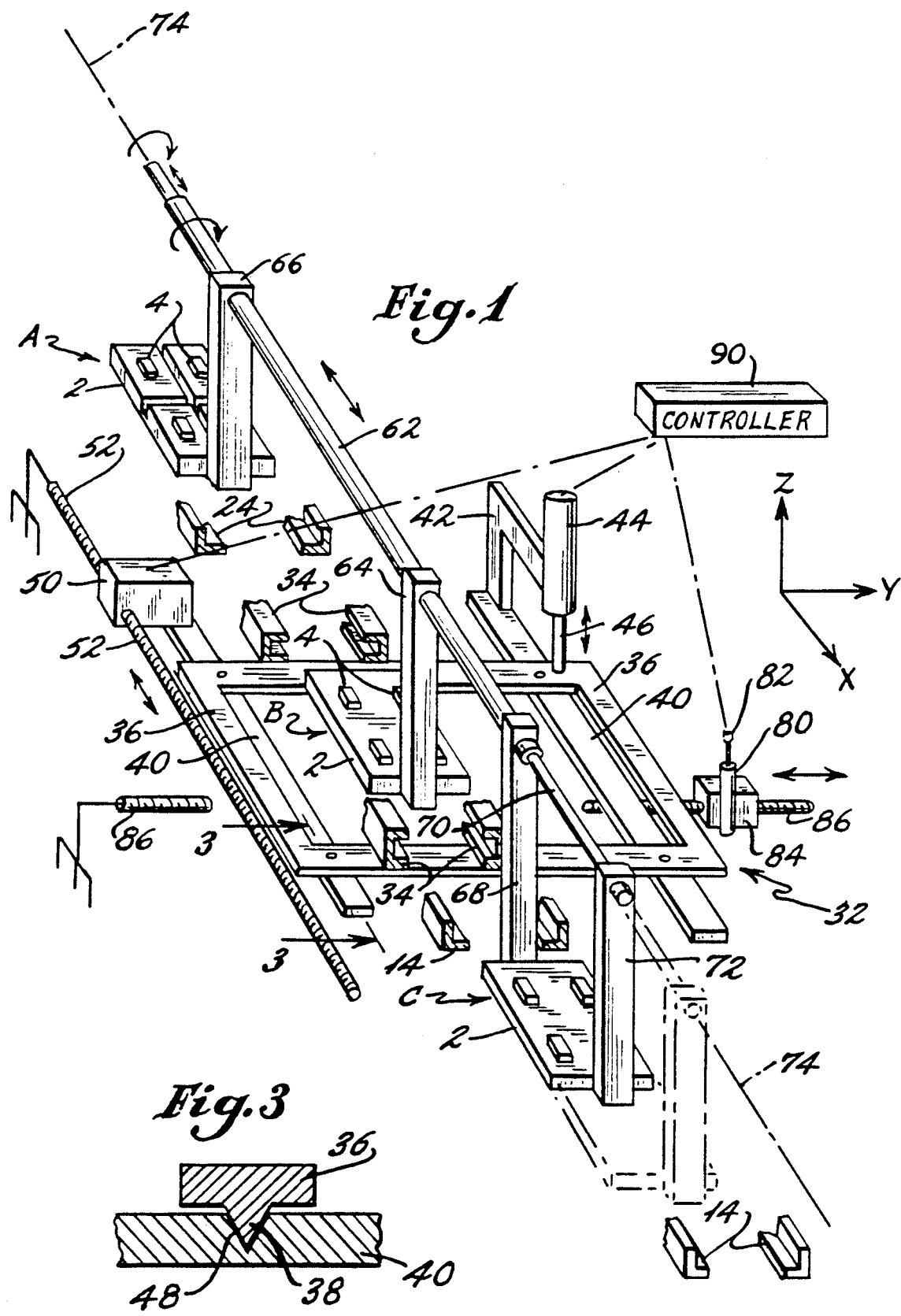

METHOD AND APPARATUS FOR INCREASING A SUBSTRATE PROCESSING AREA WITHOUT INCREASING THE LENGTH OF A MANUFACTURING LINE

This application is a continuation of U.S. application Ser. No. 07/433,091, filed Nov. 7,1989, now abandoned.

BACKGROUND OF THE INVENTION

The invention is in the field of substrate handling and, more particularly, deals with the handling of a multi-board panel made up on an array of printed circuit boards (PCB's) whose peripheries have been substantially routed from the panel leaving small unrouted webs or tabs which hold the boards in the panel with sufficient rigidity that they remain attached during subsequent automated population of the boards with components. Such a multi-board panel is generally referred to in the industry as a slotted and webbed (or tabbed) array.

The invention deals with "tab reducing" wherein all but one or two of the remaining tabs or webs supporting each populated board in the panel are removed, so as to "prep" each board for final separation or "depanelling" of individual circuit boards from the multi-board panel. The invention also deals with substrate handling in order to accomplish this.

Flexible in-line depanelling has been an illusive technology because of the difficulty in automatically handling PCB's after depanelization. Unlike the master array (panel), the individual PCB's vary greatly in sizes and shapes not designed for automatic board handling.

The invention avoids this problem by not totally extracting the PCB's from the panel. Instead, most essential tabs are removed leaving only one or two to retain each board in the master panel. These remaining tabs usually are oppositely spaced along an axis around which the individual PCB may be rotated manually to accomplish depanelling. With tab reducing, the singular PCB's are still in their "standard" array and can be transported to final assembly in "standard" carriers. Otherwise, special carriers would be required for each product type if the PCB's were totally extracted.

Usually, final assembly necessitates a person physically handling the board, so that manually extracting or depanelling the boards at that time adds very little to the overall handling cost. Although automated final assembly lines are dedicated and therefore can employ a dedicated "final" depanelling process, tab reducing offers the highest level of versatility, simplicity, speed and economy.

It is an object of the invention to feed panels of populated and tabbed boards along a manufacturing line to and from a tab reducing station at which a processing fixture is located, and to remove tabs from various locations over the area of the panel while moving the panel and not lengthening the manufacturing line.

This and other objects will become more apparent from the following detailed description of the invention.

SUMMARY OF THE INVENTION

A manufacturing line along which PCB's are fed and operated on includes a processing fixture for receiving an individual board and displacing it clear of the line toward a router bit, whereupon the router bit is shiftable transverse of the line and the processing fixture is shiftable parallel to the line and in an underlapping relation to adjacent stations so as to address the whole area of the board with the router bit while shifting the board without increasing the length of the manufacturing line.

BRIEF DESCRIPTION OF THE DRAWINGS

FIG. 1 is an isometric view, with portions broken away, of major mechanical portions of the inventive apparatus.

FIG. 3 is a partial cross section, as generally viewed in the direction of arrow 3—3 of FIG. 1.

DETAILED DESCRIPTION OF THE INVENTION

Figure 2A:
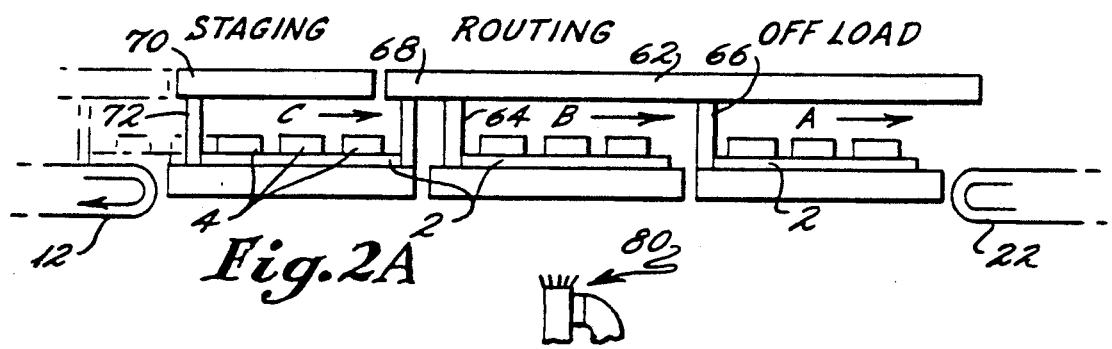
FIGS. 2A-2D are schematic in nature, and are presented for the purpose of illustrating operational steps of the invention.

For a general overview of the invention, the reader's attention is directed to FIGS. 2A-2D from which it may be seen that a manufacturing line comprises an input conveyor 12, a staging station, a routing station, an off-load station, and an output conveyor 22. A series of multi-board panels 2 are passed in-line through the various stations from the input conveyor 12 to the output conveyor 22. Movement of the panels 2 through the various stations is accomplished by means of an overhead transfer assembly having pusher bars 66, 64, and 72, with bar 72 also acting as a clamping bar in conjunction with stop bar 68.

As seen in FIG. 2A, panel C has just been shifted by bar 72 from the input conveyor station to the staging station. Bars 66, 64, and 68 are supported on tubular member 62; and pusher bar 72 is supported on a tubular member 70 which is telescopic within tubular member 62.

Figure 2B:
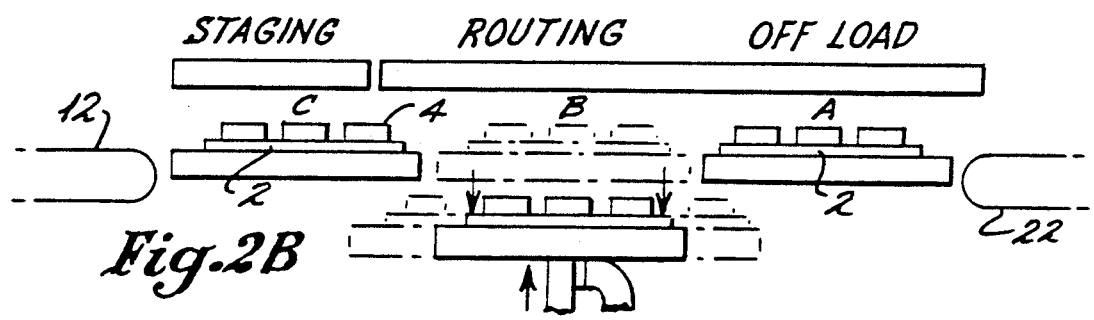
Figure 2C:
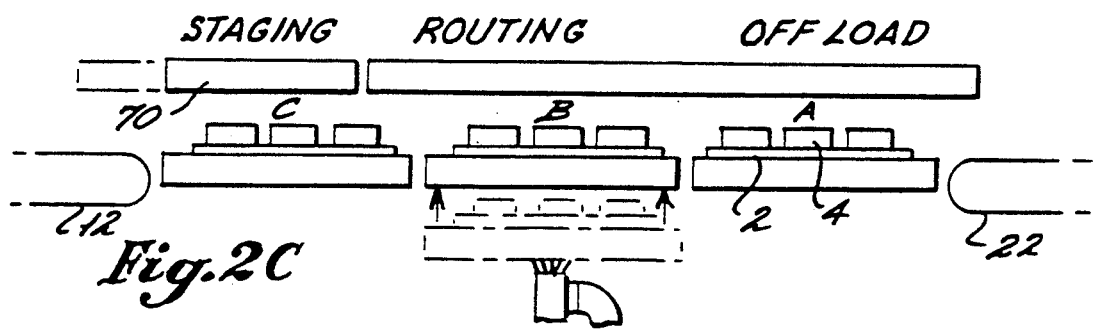
Figure 2D:
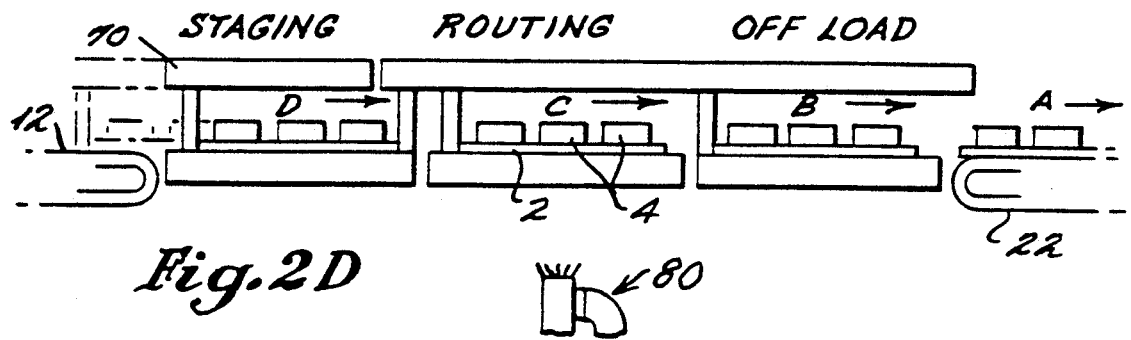

Referring to FIG. 2B, the pusher bars have been raised and the panel at the routing station is lowered clear of the adjoining stations and into position for routing by router 80, which is situated below the routing station. In order to address the whole area of the panel, the panel is shiftable back and forth in an underlapping relationship (indicated in phantom in FIG. 2B) in a direction generally parallel to the line of feed of the manufacturing line, while the router 80 is moved generally transverse to the line of feed, thus providing for relative X-Y positioning between the router and all of the various locations on the area of the panel.

After the routing is completed, the panel is raised back inline with the remaining panels at the adjacent stations (FIG. 2C) for subsequent feeding thereof, and telescoping member 70 is extended outwardly (to the left in FIG. 2C) in preparation for lowering of the pusher bars again.

Thereafter, the input and output conveyors are actuated so that a new panel D is fed to the staging area while panel A is removed from the off-load station. As may be seen from FIG. 2D, arms 66, 64, 68, and 72 have been lowered so that, upon retraction of telescoping member 70, bar 72 pulls panel D into engagement with stop bar 68. This clamps panel D for subsequent movement from the staging station to the routing station simultaneously with shifting of the panels which are located at the routing and off-load stations to their next positions.

Referring to FIG. 1, it may be seen that bars 66, 64, 68, and 72 are rotatable in concert about longitudinal axis 74 of tubular member 62 in order to raise and lower them. FIG. 1 also discloses L-shaped guide tracks 14 at the (front) staging station and similar guide tracks 24 at the (rear) off-load station, as well as channel shaped tracks 34 which are part of a processing fixture 32 located at the routing station. These various tracks and channels are only partially illustrated in FIG. 1, in order to better show the remaining portions of the processing fixture 32.

Processing fixture 32 comprises a main frame having rails 40 which are moveable back and forth along an X-axis by means of a servo motor 50 and a fixed lead screw 52. Rails 40 are on opposite sides of the feed line and are connected together in any well-known manner for simultaneous movement parallel to the X-axis by a means which is not shown. A cylinder 44 is supported on the rails 40 by a bracket 42, and the piston rod 46 is attached to frame 36 which, in turn, has channel shaped tracks 34 attached thereto. Thus, actuation of cylinder 44 causes piston 46 to raise and lower frame 36 so as to move a panel to and from the routing station in the manner illustrated in FIGS. 2B and 2C.

When frame 36 is in the lowered position, conical pins 38 (best seen in FIG. 3) register in correspondingly shaped depressions 48 of rods 40 in order to provide proper alignment of frame 36 (and thus the panel) with the router bit 82 for the subsequent routing operation.

During the routing operation, router 80 is moveable along lead screw 86 by means of servo motor 84. With lead screw 86 defining a Y-axis and lead screw 52 defining an X-axis, relative X-Y positioning is accomplished between router bit 82 and various locations on the panel which is held by processing fixture 32.

A controller 90 is in communication with servo motor 50, servo motor 84, router 80, and cylinder 44, as well as means for extending and retracting telescoping member 70 and for rotating the clamping and pushing bars about axis 74. Controller 90 is an IBM PC/XT compatible unit with keyboard and monitor which stores programs, coordinates machine operations, provides diagnostic status information, and provides for on-line programming.

Thus, the objects set forth above, among those made apparent from the preceding description, are efficiently attained and, since certain changes may be made in the construction set forth without departing from the scope of the invention, it is intended that all matter contained in the above description or shown in the accompanying drawings shall be interpreted as illustrative and not in a limiting sense.

For instance, it is considered to be well within the concept of the invention to provide that the processing fixture is moveable out of the feed path of the manufacturing line to a position above or to the side of the line prior to performing the routing. It is also contemplated that the processing fixture is moveable in the Y-direction while the router is moved in the X-direction, although this would necessitate more processing space on the sides of the manufacturing line. It is also contemplated that one or both of the adjacent stations could be shifted out of the manufacturing line to provide room for the processing fixture to move back and forth along the manufacturing line during processing, with the processing fixture overlapping the adjacent station during the processing. It is also contemplated that the processing could be other than full routing or tab reducing routing. Specifically, the processing could involve mounting of components on the circuit board by means of a pick and place head replacing the router 80 and lo being moveable along one axis while the processing fixture is moveable along an axis orthogonal thereto. It is also contemplated that other tools such as an adhesive dispenser or a solder mask applying nozzle could take the place of the router, to accomplish functions commensurate with these tools. Of course, the tool could be positioned above or to the side of the processing area.

It is also to be understood that the following claims are intended to cover all of the generic and specific features of the invention herein described, and all statements of the scope of the invention which, as a matter of language, might be said to fall therebetween.

Now that the invention has been described,

1. A method of minimizing the length of a manufacturing line having a processing station and at least one other station adjacent to said processing station and situated along a substrate feed path of said manufacturing line, and comprising the steps of:
displacing at least one of said stations clear of said feed path in preparation for said processing; and
displacing a substrate, which is situated at said processing station, in lapping relation with said other station and only along a processing path which is generally parallel to said feed path during said processing so as to provide a substrate processing area larger than an area of said processing station while not increasing said manufacturing line length or width.

2. A method as in claim 1, wherein said processing station is displaced clear of said feed path.

3. A method as in claim 1, wherein said other station is displaced clear of said feed path.

4. A method as in claim 1, and further comprising the step of:
processing said substrate during said substrate displacing.

5. A method as in claim 4, wherein said processing comprises the step of:
routing said substrate.

6. A method as in claim 1, and further comprising the steps of:
moving a tool relative to said substrate, in Y and Z directions generally normal to said feed path; and
moving said substrate relative to said tool, in an X direction orthogonal to said Y and Z directions.

7. A method as in claim 6, wherein said processing comprises the step of:
applying adhesive to particular locations on said substrate.

8. A method as in claim 6, wherein said processing comprises the step of:

9. A method as in claim 1, and further comprising the steps of:
displacing said substrate relative to a tool, along said processing path which is generally parallel to said feed path; and
displacing said tool relative to said substrate, in at least one direction which is orthogonal to said processing path, in order to facilitate said processing.

10. An apparatus for minimizing the length of a manufacturing line having a processing station and at least one other adjacent station situated along a substrate feed path of said manufacturing line, and comprising:
means for displacing at least one of said stations clear of said feed path in preparation for said processing; and means for displacing a substrate, which is situated at said processing station, in lapping relation with said other station and only along a processing path which is generally parallel to said feed path during said processing in order to provide a substrate processing area larger than an area of said processing station while not increasing said manufacturing line length or width.

11. An apparatus as in claim 10, and further comprising:
means for displacing said processing station clear of said feed path.

12. An apparatus as in claim 10, and further comprising:
means for displacing said other station clear of said feed path.

13. An apparatus as in claim 10, and further comprising:
means for processing said substrate during said substrate displacing.

14. An apparatus as in claim 13, wherein said processing means comprises:
means for routing said substrate.

15. An apparatus as in claim 10, and further comprising:
means for moving a tool relative to said substrate, in Y and Z directions generally normal to said feed path; and
means for moving said substrate relative to said tool, in an X direction orthogonal to said Y and Z directions.

16. An apparatus as in claim 15, wherein said processing means comprises:
means for applying adhesive to particular locations on said substrate.

17. An apparatus as in claim 15, wherein said processing means comprises:
means for populating said substrate with components.

18. An apparatus as in claim 10, and further comprising:
means for displacing said substrate relative to a tool, along said processing path which is generally parallel to said feed path; and
means for displacing said tool relative to said substrate, in at least one direction which is orthogonal to said processing path, in order to facilitate said processing.

* * * * *